(12) United States Patent
Shimosawa et al.

(10) Patent No.: US 8,664,512 B2
(45) Date of Patent: Mar. 4, 2014

(54) PHOTOVOLTAIC MODULE

(75) Inventors: Makoto Shimosawa, Kumamoto (JP); Shinji Fujikake, Kumamoto (JP); Hiroki Sato, Kumamoto (JP)

(73) Assignee: Fuji Electric Co., Ltd., Kanagawa (JP)

( * ) Notice: Subject to any disclaimer, the term of this patent is extended or adjusted under 35 U.S.C. 154(b) by 1 day.

(21) Appl. No.: 13/316,157

(22) Filed: Dec. 9, 2011

(65) Prior Publication Data
US 2012/0234367 A1 Sep. 20, 2012

(30) Foreign Application Priority Data
Mar. 18, 2011 (JP) .................................. 2011-060892

(51) Int. Cl.
| | |
|---|---|
| H02N 6/00 | (2006.01) |
| H01L 31/042 | (2006.01) |
| H01L 27/14 | (2006.01) |
| H01L 27/142 | (2006.01) |
| H01L 27/144 | (2006.01) |
| H01L 27/146 | (2006.01) |
| H01L 51/42 | (2006.01) |

(52) U.S. Cl.
USPC ........... 136/244; 136/249; 257/431; 257/448; 438/66; 438/67

(58) Field of Classification Search
CPC .... H01L 27/1421; H01L 31/00; H01L 31/042
USPC .......................................... 136/244, 246, 249
See application file for complete search history.

(56) References Cited

U.S. PATENT DOCUMENTS

| | | | | |
|---|---|---|---|---|
| 4,456,782 | A * | 6/1984 | Nishiura et al. | 136/244 |
| 5,421,908 | A * | 6/1995 | Yoshida et al. | 136/244 |
| 6,013,870 | A | 1/2000 | Psyk et al. | |
| 6,235,982 | B1 | 5/2001 | Saitou | |
| 2001/0023702 | A1 * | 9/2001 | Nakagawa et al. | 136/244 |
| 2002/0144724 | A1 * | 10/2002 | Kilmer et al. | 136/244 |
| 2003/0000565 | A1 | 1/2003 | Hayashi et al. | |
| 2008/0257399 | A1 * | 10/2008 | Wong et al. | 136/246 |
| 2010/0108119 | A1 * | 5/2010 | Gee et al. | 136/244 |
| 2010/0147364 | A1 * | 6/2010 | Gonzalez et al. | 136/251 |

FOREIGN PATENT DOCUMENTS

| | | |
|---|---|---|
| JP | S59-94880 A | 5/1984 |
| JP | S59-94881 A | 5/1984 |
| JP | S63-228766 A | 9/1988 |
| JP | H05-291602 A | 11/1993 |
| JP | 3237621 B2 | 12/2001 |
| JP | 2003-37280 A | 2/2003 |
| JP | 2008-153429 A | 7/2008 |

\* cited by examiner

*Primary Examiner* — Jennifer Michener
*Assistant Examiner* — Mayla Gonzalez Ramos
(74) *Attorney, Agent, or Firm* — Chen Yoshimura LLP

(57) ABSTRACT

The present invention provides a photovoltaic module with bypass diodes that has a high electricity generating capacity per unit area and high productivity. This photovoltaic module includes a photovoltaic cell assembly in which a plurality of photovoltaic cells are electrically connected in series, and a diode assembly in which a plurality of diodes are formed on a substrate in the arrangement that is consistent with the arrangement of the photovoltaic cells to which the diodes are to be attached. The diode assembly is disposed on a non-light receiving side of the photovoltaic cells, and the diodes are electrically connected to the photovoltaic cells. The photovoltaic cell assembly and the diode assembly are sealed and united by a sealant.

10 Claims, 5 Drawing Sheets

(a)

(b)

(a)

(b)

PHOTOVOLTAIC MODULE

TECHNICAL FIELD

The present invention relates to a photovoltaic module that has a bypass diode.

BACKGROUND ART

A photovoltaic module is designed by electrically connecting a plurality of photovoltaic cells in series so that a predetermined output can be obtained.

In certain situations when the photovoltaic cells are not generating electricity (in situations when the sun light to the photovoltaic cells is obstructed), their resistivity increases and the electrical power that can be extracted decreases. Also, there is a possibility that heat will be generated due to the resistive loss and this may lead to heat damages and the like. Thus, diodes are electrically connected in parallel to the photovoltaic cells and when there is a failure in the photovoltaic cells, currents are bypassed through the diodes. This way, decrease in the extracted electrical power and damages to the photovoltaic cells are prevented. The diodes connected in this way are called bypass diodes.

Typically, molded type diodes are connected to the outer sides of the photovoltaic cells as bypass diodes. However, in the case of molded type diodes, it was necessary to install respective diodes one by one to the photovoltaic cells. This was a problem because of its low workability in attaching them. Also, since the diodes are disposed on the outer sides of the photovoltaic cells, the area not contributing to the electric generation increases and there was a problem that the electricity generation capacity per unit area decreases.

Patent Document 1 discloses protection diodes that are formed by laminating a metallic electrode, an amorphous silicon layer, and a metallic electrode in this order on a flexible thin film on a metallic electrode layer side of a thin film photovoltaic cell. Patent Document 1 further discloses that many protection diodes can be formed on a common insulating substrate and attached onto the photovoltaic element.

Related Art Documents

Patent Documents

Patent Document 1: Japanese Patent Application Laid-Open Publication No. S59-94881

SUMMARY OF THE INVENTION

Problems to be Solved by the Invention

Using a method of having many diodes formed on a common insulating substrate, and then attaching them to photovoltaic cells, a plurality of diodes can be attached simultaneously. However, if an arrangement pattern of the diodes and an arrangement pattern of the photovoltaic cells differ from each other, it may be difficult to attach the diodes to the intended photovoltaic cells, requiring more time and effort for the attaching work in such a case.

Accordingly, an object of the present invention is to provide a photovoltaic module including bypass diodes that has a high electric generating capacity per unit area and high productivity.

A photovoltaic module of the present invention includes a photovoltaic cell assembly having a plurality of photovoltaic cells electrically connected in series, and a diode assembly having a plurality of diodes formed on a substrate in an arrangement that is consistent with an arrangement of the photovoltaic cells to which the diodes are to be attached, wherein the diode assembly is disposed on a non-light receiving surface side of the photovoltaic cell assembly, the diodes are electrically connected to the photovoltaic cells, and the photovoltaic cell assembly and the diodes assembly are sealed and united by a sealant.

In the photovoltaic module of the present invention, it is preferable that the substrate on which the plurality of diodes are formed be a flexible film substrate.

In the photovoltaic module of the present invention, it is preferable that the diode assembly is attached to the photovoltaic cell assembly by a conductive adhesive tape, and the conductive adhesive tape connects to the photovoltaic cells.

In the photovoltaic module of the present invention, it is preferable that the area of the diode assembly to be attached to the photovoltaic cell assembly be less than or equal to the area of the photovoltaic cell assembly, and that the diode assembly be disposed so that it does not protrude beyond the outer periphery of the photovoltaic cell assembly.

It is preferable that the diode assembly of the photovoltaic module of the present invention includes the plurality of the diodes each formed by laminating a first electrode layer, a semiconductor layer, and a second electrode layer in this order on one surface of the substrate, and a plurality of third electrode layers formed on the other surface of the substrate, wherein each of the third electrode layers is connected to the second electrode layer by a conductor that is substantially insulated from the first electrode layer through a first through hole that penetrates the first substrate, the first electrode layer, and the semiconductor layer, and wherein each of the third electrode layers is connected to the first electrode layer of an adjacent diode by a conductor that is substantially insulated from the second electrode layer through a second through hole that penetrates the substrate.

It is preferable that the diode assembly of the photovoltaic module of the present invention be disposed so that its diode side be facing the non-light receiving surface side of the photovoltaic cell assembly or its third electrode layer side be facing the non-light receiving surface side of the photovoltaic cell assembly.

It is preferable that the photovoltaic cell assembly of the photovoltaic module of the present invention include a substrate, the plurality of photovoltaic cells each constituted by laminating a backside electrode layer, a photoelectric conversion layer, and a transparent electrode layer in this order on one surface of the substrate, and a plurality of rear electrode layers formed on the other surface of the substrate, wherein each of the rear electrode layers is connected to the transparent electrode layer by a conductor that is substantially insulated from the backside electrode layer through a first through hole that penetrates the substrate, the backside electrode layer, and the photoelectric conversion layer, and wherein each of the rear electrode layers is connected to the backside electrode layer of an adjacent photovoltaic cell by a conductor that is substantially insulated from the transparent electrode layer through a second through hole that penetrates the substrate.

Effects of the Invention

The photovoltaic module of the present invention can obtain stable photovoltaic characteristics without losing the electricity generating capacity of the photovoltaic cells, even when the sun light to a part of the photovoltaic cells is obstructed. This is due to the diode assembly being disposed on a non-light receiving surface side of the photovoltaic cell assembly. Also, this diode assembly is formed on a substrate so that a plurality of diodes are in an arrangement that is consistent with the arrangement of the photovoltaic cells to which the diodes are to be attached. Thus, alignment of the diodes to the photovoltaic cells to which the diodes are intended to be attached becomes easy, and the diodes can be attached to the intended photovoltaic cells reliably with good workability.

BRIEF DESCRIPTION OF THE DRAWINGS

FIG. 6(a) shows a condition in which one diode is attached to one photovoltaic cell, and FIG. 6(b) shows a condition in which one diode is attached to three photovoltaic cells.

DETAILED DESCRIPTION OF EMBODIMENTS

Embodiment 1 of a photovoltaic module in the present invention is described with reference to FIGS. 1 to 6.

Figure 1:
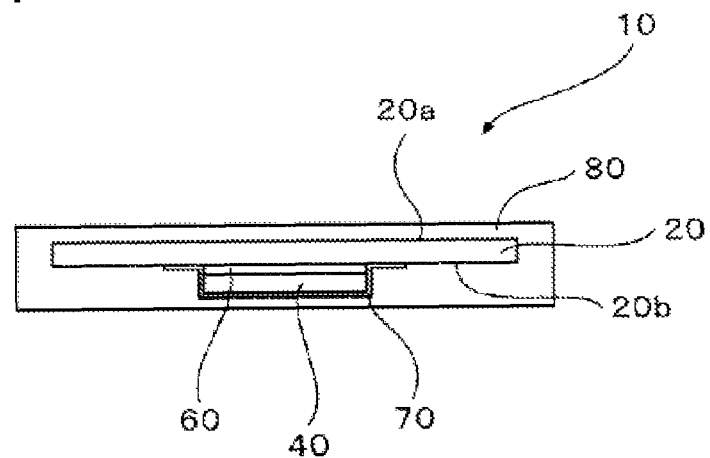
FIG. 1 is a schematic view of a photovoltaic module according to Embodiment 1 of the present invention.
Figure 2:
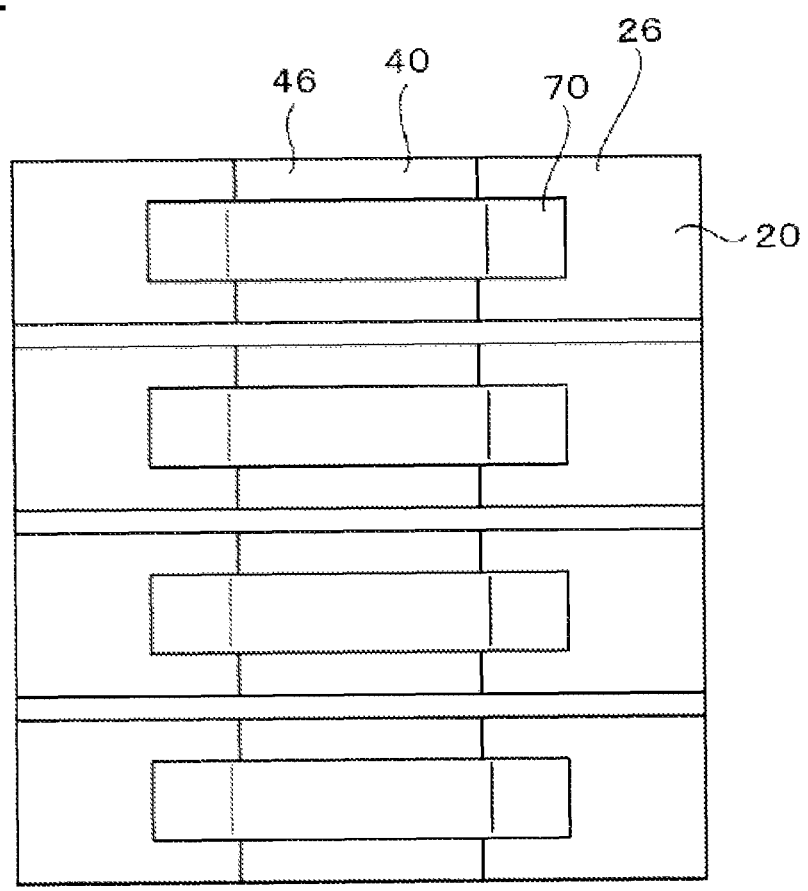
FIG. 2 is a bottom plan view of the photovoltaic module.

As shown in FIGS. 1 and 2, this photovoltaic module 10 is constituted mainly by a photovoltaic cell assembly 20 and a diode assembly 40. The diode assembly 40 is connected to a non-light receiving surface side 20b of the photovoltaic cell assembly 20 through an insulating layer 60. Also, the diode assembly 40 is electrically connected to the photovoltaic cell assembly 20 through a conductive adhesive tape 70 that has conductivity also on an adhesive part. Further, the entirety of the photovoltaic cell assembly 20 and the diode assembly 40 are sealed and united by a sealant 80.

The insulating layer 60 is not particularly limited as long as it has the insulating property. For example, the insulating layer 60 can be a resin material, such as ethylene-vinyl acetate copolymer resin (EVA), epoxy resin, or fluorine resin.

The conductive adhesive tape 70 can be formed of a conductive base material such as copper foil, or aluminum foil having a conductive adhesive layer of metallic powder mixed with a glue formed thereon or the like.

The sealant 80 is not particularly limited. For example, a film or the like made of a material that has a high thermal and weather resistance, such as ethylene tetrafluoroethylene copolymer (ETFE) or the like, can be used.

Figure 3:
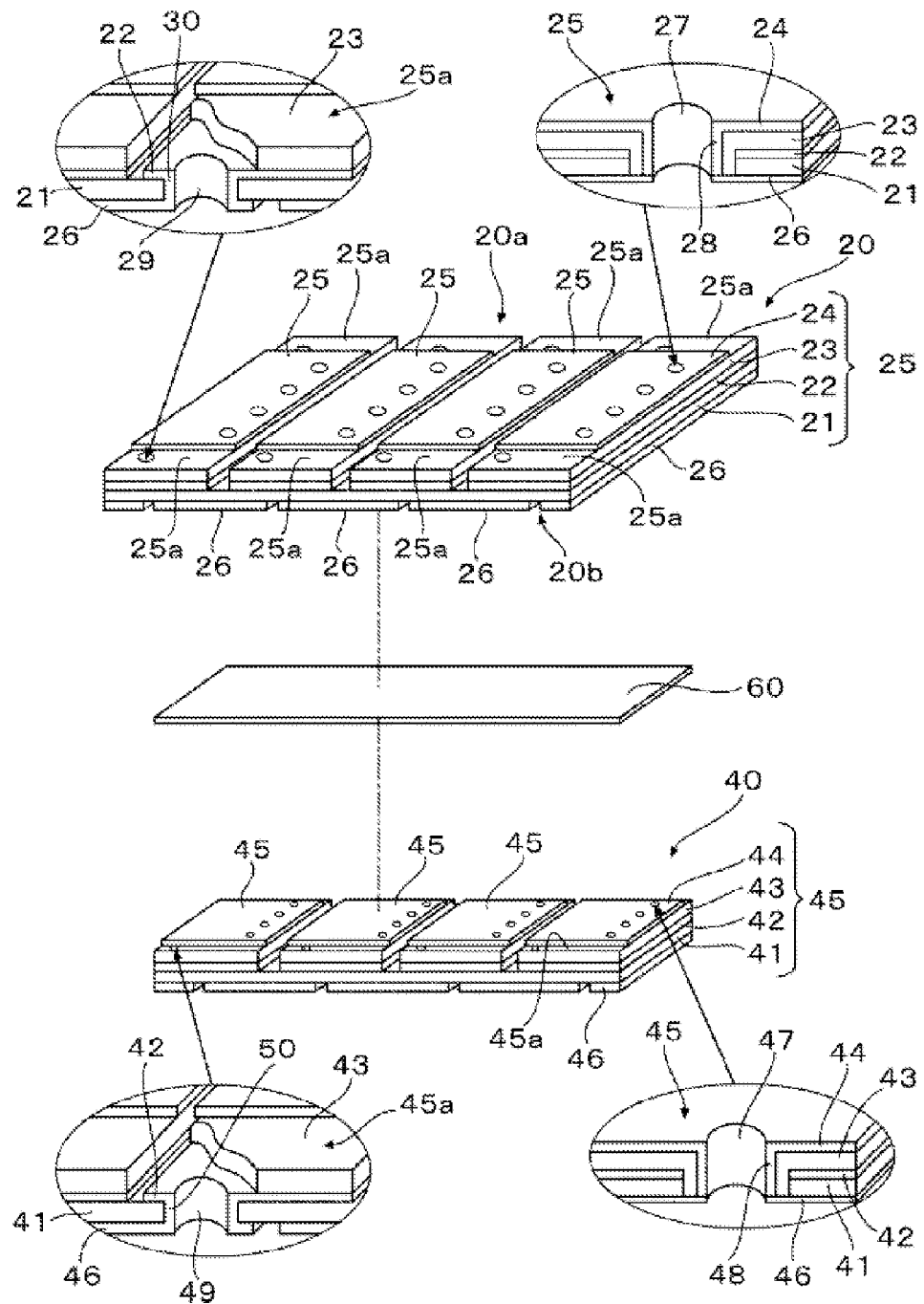
FIG. 3 is an exploded perspective view of a photovoltaic cell assembly and a diode assembly of the photovoltaic module.

As shown in FIG. 3, the photovoltaic cell assembly 20 is made of a plurality of photovoltaic cells 25 that are formed on a single substrate and are electrically connected in series.

With reference to FIG. 3, the photovoltaic cells 25 are constituted by laminating a backside electrode layer 22, a photoelectric conversion layer 23, and a transparent electrode 24 in this order on a light receiving surface side 20a of the substrate 21. The plurality of photovoltaic cells 25 are formed in this photovoltaic cell assembly 20. Connection sections 25a, 25a that are formed by laminating the backside electrode layer 22 and the photoelectric conversion layer 23 in this order are provided on both end parts of each of the photovoltaic cells 25, where the transparent electrode layer 24 is not formed. Also, a plurality of rear electrode layers 26 are formed on the non-light receiving surface 20b of the substrate 21 with substantially the same spacing as the respective photovoltaic cells 25, but staggered toward a side of the respective adjacent photovoltaic cells.

Figure 4:
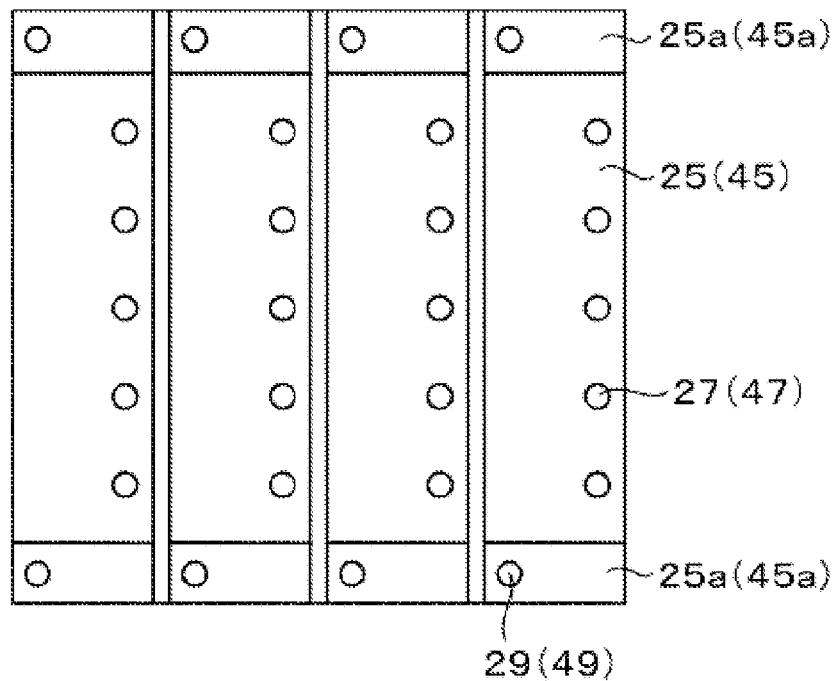
FIG. 4 is a plan view of a transparent electrode layer (second electrode layer) side of the photovoltaic cell assembly (diode assembly) of the photovoltaic module.
Figure 5:
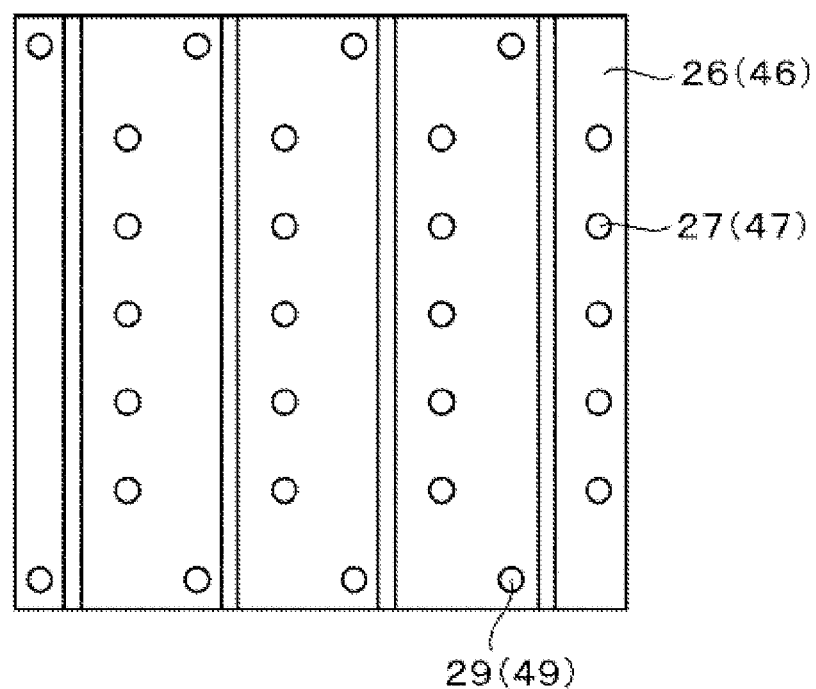
FIG. 5 is a plan view of a rear electrode layer (third electrode layer) side of the photovoltaic cell assembly of the photovoltaic module.
Figure 6:
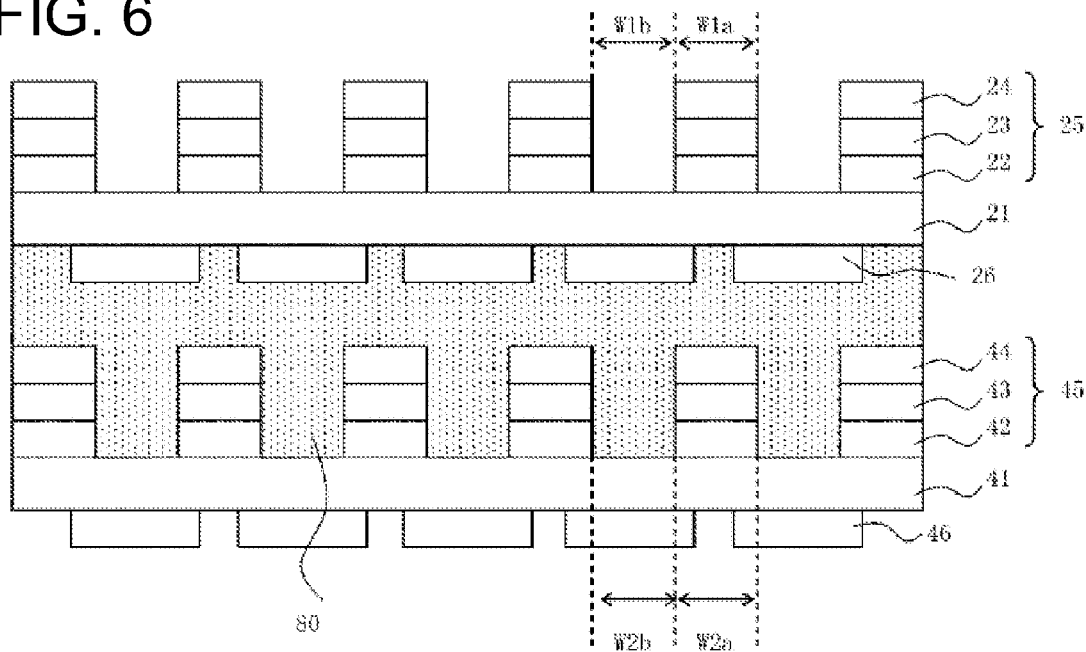
FIG. 6 shows conditions in which the photovoltaic cell assembly and the diode assembly of the photovoltaic module are connected to each other.
Figure 6:
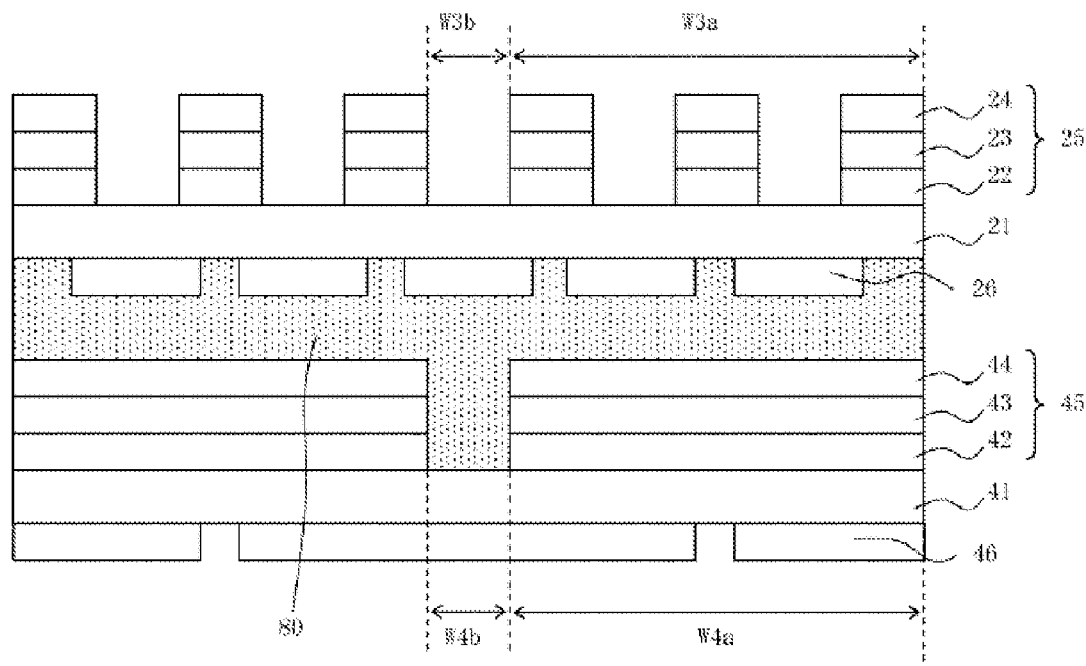

With reference to FIGS. 3 to 5, a first through hole 27 is formed by penetrating the rear electrode layer 26, the substrate 21, the backside electrode layer 22, the photoelectric conversion layer 23, and the transparent electrode layer 24. A plurality of the first through holes 27 are formed with a predetermined spacing in the respective photovoltaic cells 25. As shown in FIG. 2, the transparent electrode layer 24 is electrically connected to the rear electrode layer 26 by a conductor layer 28 in the first through hole 27. Also, the backside electrode layer 22 is covered by the photoelectric conversion layer 23, and is insulated from the transparent electrode layer 24, the conductor layer 28, and the rear electrode layer 26.

A second through hole 29 that is formed by penetrating the rear electrode layer 26, the substrate 21, and the backside electrode layer 22, is formed on the connection section 25a of the photovoltaic cell 25. The rear electrode layer 26 is electrically connected to the backside electrode layer 22 by a conductor layer 30 in the second through hole 29.

Electrons generated by the electric generation of each of the photovoltaic cells 25 move to the connection section 25a, go through the second through hole 29, and move to the rear electrode layer 26 of the photovoltaic cell 25. The electrons that have moved to the rear electrode layer 26 go through the first through hole 27 and move to the transparent electrode layer 24 of the adjacent photovoltaic cell 25. As described above, the respective photovoltaic cells 25 are connected in series through the first through hole 27 and the second through hole 29 in this photovoltaic cell assembly 20. The structure such as this is called SCAF (Series Connection through Apertures on Film) structure. This structure can be manufactured by film formations of the respective electrode layers and the photoelectric conversion layer, patterning of the respective layers, and by combination of these processes. For example, this structure can be manufactured by a method described in JP Patent No. 3237621 (U.S. Pat. No. 6,235,982).

An example of a manufacturing method of this photovoltaic cell assembly 20 is described as follows. The backside electrode layer 22 is formed on the light receiving surface side of the substrate 21 that has the second through hole 29 formed as an opening therein, and the rear electrode layer 26 is formed on the non-light receiving surface side. This way, the backside electrode layer 22 is electrically connected to the rear electrode layer 26 by an inner wall of the second through hole 29. Next, the first through hole 27 that penetrates the substrate 21, the backside electrode layer 22, and the rear electrode layer 26 is formed. Next, the photoelectric conversion layer 23 is formed on the entire surface of the light receiving surface side of the substrate 21. Further, the transparent electrode layer 24 is formed by masking both end parts of the photoelectric conversion layer 23. Next, a rear electrode layer is formed again on the rear electrode layer 26 of the substrate 21. This way, the transparent electrode layer 24 is electrically connected to the rear electrode layer 26 by an inner wall of the first through hole 27. Further, the photovoltaic cell assembly of the above described SCAF structure is manufactured by dividing the photovoltaic cells 25 and the rear electrode layer 26 into respective predetermined shapes.

The substrate 21 that has a high thermal resistance is preferably used. For example, a glass substrate, a metallic substrate, a resin substrate, and the like can be used. Of these, a flexible film substrate made of polyimide, polyethylene naphthalate, polyethersulfone, polyethylene terephthalate, aramid or the like can preferably be used. With the use of a flexible film substrate, the photovoltaic cell assembly can be made to be flexible. The film thickness of the substrate 21 is not particularly limited. However, in view of flexibility, strength, and weight, 15 µm to 200 µm is preferable.

The backside electrode layer 22 is not particularly limited. For example, Ag, Ag alloy, Ni, Ni alloy, Al, Al alloy or the like can be used.

The photoelectric conversion layer 23 is not particularly limited. PIN type or NIP type amorphous silicon series, microcrystalline silicon thin film, or the like can be used.

The transparent electrode layer 24 is not particularly limited. ITO, SnO2, ZnO or the like can be used.

The rear electrode layer 26 is not particularly limited. Ag, Ag alloy, Ni, Ni alloy, Al, Al alloy, or the like can be used.

On the other hand, the diode assembly 40 is disposed on the non-light receiving surface side 20b of the photovoltaic cell assembly 20. In the diode assembly 40, a plurality of diodes 45 are formed on the substrate 41 in an arrangement that is consistent with the arrangement of the photovoltaic cells 25 to which the diodes 45 are to be attached. Therefore, the diode assembly 40 is disposed on the rear electrode layer 26 side of the photovoltaic cell assembly 20. Further, the diode 45 is electrically connected in parallel to the photovoltaic cell 25 and in the reverse polarity direction, as shown in FIG. 3.

As shown in FIGS. 1 and 2, the area of the diode assembly 40 preferably is less than or equal to the area of the photovoltaic cell assembly 20 and is disposed so as not to protrude beyond the periphery of the photovoltaic cell assembly 20. If the area of the diode assembly 40 is larger than the area of the photovoltaic cell assembly 20 or is disposed so as to protrude beyond the periphery of the sola battery cell assembly 20, then the part of the photovoltaic module that is not contributing to the electric generation increases. Accordingly, the electric generation efficiency per unit area of the photovoltaic module decreases.

Here, the meaning of "a plurality of diodes 45 are formed in an arrangement that is consistent with the arrangement of the photovoltaic cells 25 to which the diodes 45 are to be attached" is as follows. As shown in FIG. 6(a), in the case that each of the diodes 45 is attached to the corresponding photovoltaic cell 25 (that is, in the case that one diode is attached to one photovoltaic cell), the width W1a of the photovoltaic cell 25 and the width W2a of the diode 45 are substantially the same, and the space W1b in the arrangement of the photovoltaic cells 25 and the space W2b in the arrangement of the diodes 45 are substantially the same. As shown in FIG. 6(b), in the case that a single diode 45 is attached to a plurality (there are three of them in FIG. 6(b)) of photovoltaic cells 25, the width W3a of a group of photovoltaic cells 25' to which the single diode 45 is to be attached and the width W4a of the diode 45 are substantially the same, and the space W3b in the arrangement of the group of photovoltaic cells 25' and the space W4b in the arrangement of the diodes 45 are substantially the same. Here, even with a configuration like FIG. 6(a), if the electrical connection position between the photovoltaic cell 25 and the diode 45 is provided on every third photovoltaic cell, for example, then the diode wiring is substantially equivalent to that of FIG. 6(b).

With reference to FIG. 3, this diode assembly 40 has the same SCAF structure as the above-described photovoltaic cell assembly 20.

That is, the diode 45 is constituted by laminating a first electrode layer 42, a semiconductor layer 43, and a second electrode layer 44 in this order on a surface of the substrate 41, and a plurality of the diodes 45 are formed on the surface of the substrate 41. The width of the diode 45 and the spacing in the arrangement of the diodes 45 are substantially the same as the width of the photovoltaic cell 25 and the spacing in the arrangement of the photovoltaic cells 25, respectively.

Connection sections 45a, 45a that are formed by laminating the first electrode layer 42, and the semiconductor layer 43 in this order are provided on both end parts of each diode 45 where the second electrode layer 44 is not formed. Also, a plurality of third electrode layers 46 are formed on the other side of the substrate 41 with substantially the same spacing as the diodes 45, but staggered toward respective adjacent diodes.

With reference to FIGS. 3 to 5, a first through holes 47 is formed by penetrating the third electrode layer 46, the substrate 41, the first electrode layer 42, the semiconductor layer 43, and the second electrode layer 44. A plurality of the first through holes 47 are formed with a predetermined spacing in each of the diodes 45. The second electrode layer 44 is electrically connected to the third electrode layer 46 by a conductor layer 48 in the first through hole 47. Also, the first electrode layer 42 is covered by the semiconductor layer 43, and insulated from the second electrode layer 44, the conductor layer 48, and the third electrode layer 46.

On the connection section 45a of the diode 45, a second through hole 49 is formed by penetrating the third electrode layer 46, the substrate 41, and the first electrode layer 42. The third electrode layer 46 is electrically connected to the first electrode layer 42 by a conductor layer 50 in the second through hole 49.

The diode assembly 40 is attached to the non-light receiving surface side 20b of the photovoltaic cell assembly 20 through the insulating layer 60 with its diode 45 side facing the photovoltaic cell assembly 20 side. Also, the conductive adhesive tape 70 is attached between the third electrode layer 46 of the diode assembly 40 and the corresponding rear electrode layer 26 of the photovoltaic cell assembly 20. Thus, the third electrode layer 46 of the diode assembly 40 is electrically connected to the rear electrode layer 26 of the photovoltaic cell assembly 20.

The substrate 41 that has a high thermal resistance is preferably used. For example, a glass substrate, a metallic substrate, a resin substrate, and the like can be used. It is preferable that the same material as that of the substrate 21 of the photovoltaic cell assembly 20 be selected. Of these materials, a flexible film substrate made of polyimide, polyethylene naphthalate, polyethersulfone, polyethylene terephthalate, aramid, or the like can preferably be used. With the use of the flexible film substrate, the flexibility of the diode assembly can be improved and the flexibility of the photovoltaic cell assembly is not sacrificed. Also, with the selection of the same material as that of the substrate 21 of the photovoltaic cell assembly 20, the thermal expansion coefficients of the photovoltaic cell assembly 20 and the bypass diode assembly 40 become substantially the same. Thus, detachment and deformation at the interface of these assemblies can be decreased.

The film thickness of the substrate 41 is not particularly limited. In view of flexibility, strength, and weight, however, 15 µm to 200 µm is preferable.

The materials for first electrode layer 42, the second electrode layer 44, and the third electrode layer 46 are not particularly limited. For example, ITO, ZnO, SnO2, Ag, Ag alloy, Ni, Ni alloy, Al, Al alloy, or the like can be used. The semiconductor layer 43 is not particularly limited. For example, PIN type or NIP type amorphous silicon, microcrystalline silicon thin film, or the like can be used. The diode 45 is connected in parallel and in the reverse polarity direction to the photovoltaic cell 25. Thus, no current flows through the diode 45, when the photovoltaic cell 25 to which the diode 45 is attached is generating electricity.

On the other hand, if a particular photovoltaic cell 25 stops generating electricity when it is in shade, for example, electrons move from the rear electrode 26 of the adjacent photovoltaic cell 25 on one side to the third electrode layer 46 of the corresponding diode 45 through the conductive adhesive tape 70. The electrons that have moved to the third electrode layer 46 of the corresponding diode 45 move to the first electrode layer 42 through the second through hole 49. The electrons that have moved to the first electrode layer 42, move to the second electrode layer 44 through the semiconductor layer 43, and move to the first through hole 47. Further, through the first through hole 47, the electrons move to the third electrode layer 46 of the adjacent diode 45. Then, the electrons move to the rear electrode layer 26 of the adjacent photovoltaic cell 25 on the other side through the conductive adhesive tape 70.

As described above, even when the sun light to a part of the photovoltaic cells 25 is obstructed because a part of the photovoltaic module is in shade, for example, current flows to the next photovoltaic cell 25 by bypassing the photovoltaic cell 25 that is not generating electricity. Thus, stable photovoltaic characteristics can be obtained.

In the photovoltaic module of the present invention, the diode assembly 40 is disposed on the non-light receiving side of the photovoltaic cell assembly 20. Thus, even when the sun light to a part of the photovoltaic cells is obstructed, stable photovoltaic characteristics can be obtained without losing the electricity generation capacity of the photovoltaic cell 25. Also, in the case that the diode assembly having a film like substrate is used as the diode assembly 40, that is, a flexible film substrate is used as the substrate 41, the diode assembly 40 is thin and flexible. Thus, the thickness and weight of the entire photovoltaic module do not increase very much. Further, when the photovoltaic cell assembly 20 has flexibility, the flexibility of the module is ensured.

Also, in this diode assembly 40, a plurality of diodes 45 are formed on the substrate 41 in an arrangement consistent with the arrangement of the photovoltaic cells 25 to which the diodes 45 are to be attached. Thus, alignment of the diodes 45 to the photovoltaic cells 25 to which the diodes are to be attached becomes easy, and the diodes 45 can be attached to the intended photovoltaic cells 25 reliably with good workability.

Here, the diodes 45 are electrically connected to the photovoltaic cells 25 by attaching the diode assembly 40 to the photovoltaic assembly 20 using the conductive adhesive tape 70 in the present embodiment. However, measures to electrically connect the diodes 45 to the photovoltaic cells 25 are not limited to a conductive adhesive tape. Conventional methods such as conductive paste, or soldering can be used to make the connection. Of these methods, the conductive adhesive tape has good workability and does not involve a heating process. Thus, there are no damages and the like to the photovoltaic cells due to heat. Accordingly, the conductive adhesive tape is particularly preferable. Alternatively, the diode 45 may be electrically connected to the photovoltaic cell 25 by opening a hole in a part of the insulating layer 60. In such a case, the rear electrode 26 of the photovoltaic cell assembly 20 and the second electrode layer 44 of the diode assembly 40 are electrically conducting in the area where there is no insulating layer 60. This way, it is not necessary to attach the conductive adhesive tape and this can contribute to reduction of the material costs and the work process. Further, the insulating layer 60 between the photovoltaic cell assembly 20 and the diode assembly 40 may be eliminated so that the rear electrode 26 of the photovoltaic cell assembly 20 is in direct contact with the second electrode layer 44 of the diode assembly 40. This contributes to making the entire module thin and light weight, and eliminates the need to attach the conductive adhesive tape. Thus, this can also contribute to reduction of the material costs and shortening of the work process.

Also, in this embodiment, the photovoltaic cell assembly 20 and the diode assembly 40 both used the SCAF structure. However, only one of them can use the SCAF structure, or both can use structures other than the SCAF structure. In the case that the photovoltaic cell assembly 20 and the diode assembly 40 both have the same structure, for example, the same SCAF structure, the photovoltaic cell assembly 20 and the diode assembly 40 can be manufactured by the same manufacturing line. Thus, manufacturing equipments can be efficiently used.

Structures for the photovoltaic cell assembly other than the SCAF structure may be as follows. For example, a plurality of photovoltaic cells are formed on the light receiving surface side of a substrate, and each of the photovoltaic cells is connected in series. In another example, a photoelectric conversion layer, a transparent electrode layer and the like are formed on a conductive substrate, and, a plurality of collecting electrodes are formed with a predetermined spacing on a part of the transparent electrode layer. In yet another example, a substrate itself is a part the photoelectric conversion layer and a plurality of structural units in each one of which an electrode layer is formed on the opposite side of the light receiving surface are connected in series. Also, a diode assembly that has a structure other than the SCAF structure may be as follows. For example, a plurality of bypass diodes are formed on a surface of a substrate, and each of the diodes is connected in series and the like.

Also, in this embodiment, the photovoltaic cell has a substrate structure in which the backside electrode layer, the photoelectric conversion layer, and the transparent layer are laminated in this order on the substrate. However, the photovoltaic cell may have a superstrate structure in which the transparent electrode layer, the photoelectric conversion layer, and the electrode layer are laminated in this order on the transparent substrate. Here, in the case that the photovoltaic cell has the Superstrate structure, the bypass diode assembly 40 is disposed on the electrode layer, since the electrode layer side becomes the non-light receiving surface and the transparent substrate side becomes the light receiving surface.

Figure 7:
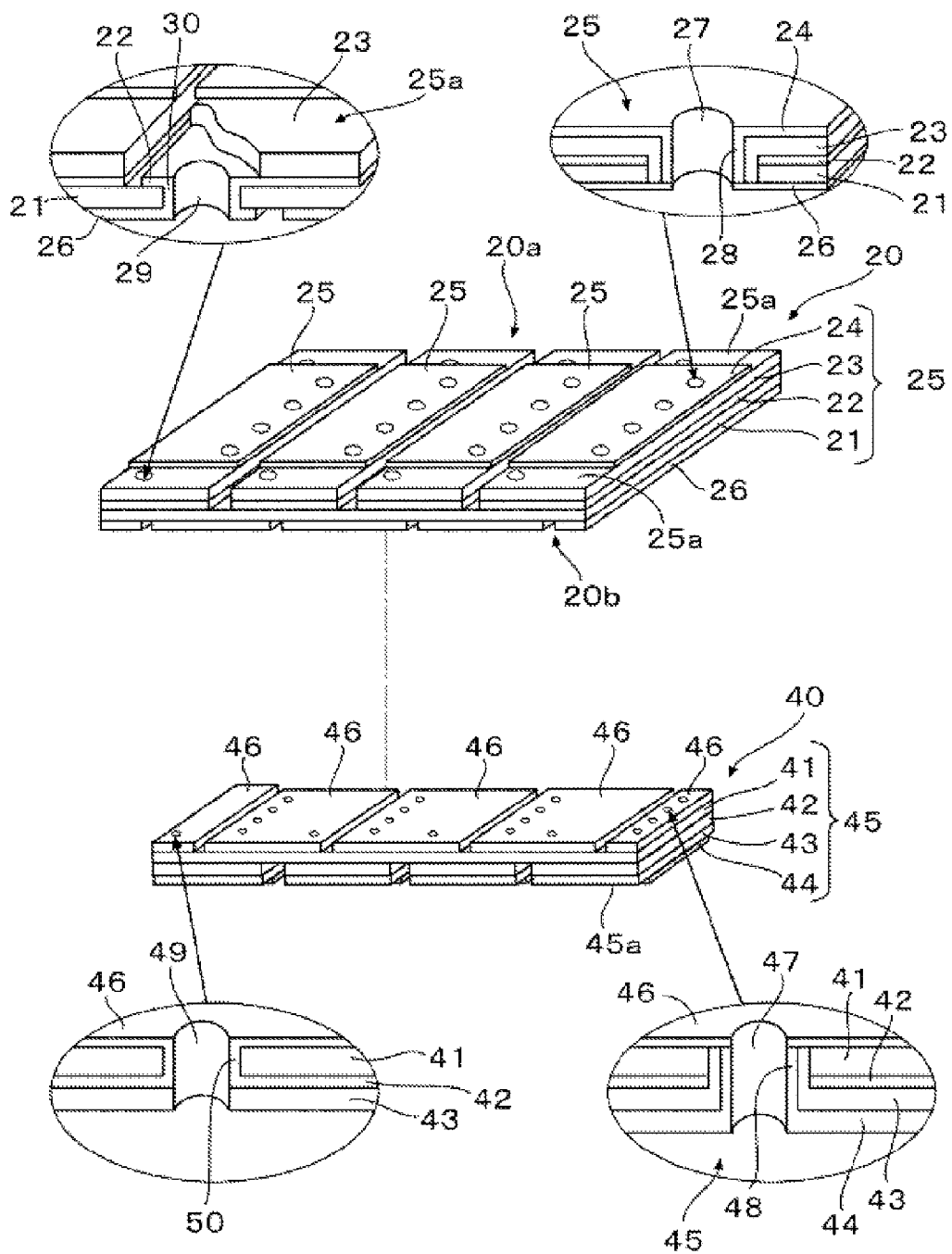
FIG. 7 is a schematic view of a photovoltaic module according to Embodiment 2 of the present invention.

Embodiment 2 of a photovoltaic module in the present invention is described with reference to FIG. 7.

In this embodiment, the diode assembly 40 is disposed on the non-light receiving surface side 20b of the photovoltaic cell assembly 20 so that its third electrode layer 46 side is facing the photovoltaic cell assembly side. That is, the third electrode layer 46 of the diode assembly 40 is in contact with the rear electrode layer 26 of the photovoltaic cell assembly 20 and both are electrically connected.

In this embodiment also, as in Embodiment 1, when a particular photovoltaic cell 25 becomes shaded and stops generating electricity, electrons from the rear electrode layer 26 of the adjacent photovoltaic cell 25 on one side move to the third electrode layer 46 of the corresponding diode 45. The electrons that have moved to the third electrode layer 46 of the corresponding diode 45 move to the first electrode layer 42 through the second through hole 49. The electrons that have moved to the first electrode layer 42 move to the second electrode layer 44 through the semiconductor layer 43, and then move to the first through hole 47. Further, the electrons move to the third electrode layer 46 of the adjacent diode 45 through the first through hole 47, and the electrons move to the rear electrode layer 26 of the adjacent photovoltaic cell 25 on the other side.

According to this embodiment, even when the SCAF structure is used for the photovoltaic cell assembly 20, this embodiment can contribute to making the entire module thin and light weight because there is no insulating layer. In addition, this embodiment can contribute to reduction of the material costs and the work process because there is no need to attach the conductive tape since the electrodes are in direct contact with each other.

The invention claimed is:

1. A photovoltaic module comprising:
 a photovoltaic cell assembly having a plurality of photovoltaic cells electrically connected in series and arranged laterally with a prescribed spacing therebetween; and
 a diode assembly having a plurality of diodes formed on a substrate in an arrangement that is consistent with an arrangement of the photovoltaic cells to which the diodes are to be attached,
 wherein the diode assembly is disposed on a non-light receiving surface side of the photovoltaic cell assembly such that one or more of the photovoltaic cells are directly above one diode and that each spacing between adjacent diodes correspond to said prescribed spacing between the photovoltaic cells, and the diodes are electrically connected to the photovoltaic cells such that when at least one of the photovoltaic cells in said one or more of the photovoltaic cells stop generating electricity, said diode underneath bypasses the photovoltaic cell that stopped generating electricity; and
 wherein the diode assembly includes:
 the plurality of the diodes each formed by laminating a first electrode layer, a semiconductor layer, and a second electrode layer in this order on one surface of the substrate; and
 a plurality of third electrode layers formed on the other surface of the substrate,
 wherein each of the third electrode layers is connected to the second electrode layer by a conductor that is substantially insulated from the first electrode layer through a first through hole that penetrates the first substrate, the first electrode layer, and the semiconductor layer, and
 wherein said each of the third electrode layers is connected to the first electrode layer of an adjacent diode by a conductor that is substantially insulated from the second electrode layer through a second through hole that penetrates the first substrate.

2. The photovoltaic module according to claim 1, wherein the substrate on which the plurality of diodes are formed is a flexible film substrate.

3. The photovoltaic module according to claim 1, wherein the diode assembly is attached to the photovoltaic cell assembly by a conductive adhesive tape, and the conductor adhesive tape connects to the photovoltaic cells.

4. The photovoltaic module according to claim 1, wherein an area of the diode assembly to be attached to the photovoltaic cell assembly is less than or equal to an area of the photovoltaic cell assembly, and that the diode assembly is disposed so that it does not protrude beyond the outer periphery of the photovoltaic cell assembly.

5. The photovoltaic module according to claim 1, wherein the diode assembly is disposed so that its diode side is facing the non-light receiving surface side of the photovoltaic cell assembly.

6. The photovoltaic module according to claim 1, wherein the diode assembly is disposed so that its third electrode layer side is facing the non-light receiving surface side of the photovoltaic cell assembly.

7. The photovoltaic module according to claim 1,
 wherein the photovoltaic cell assembly includes;
 a substrate;
 the plurality of photovoltaic cells each constituted by laminating a backside electrode layer, a photoelectric conversion layer, and a transparent electrode layer in this order on one surface of the substrate; and
 a plurality of rear electrode layers formed on the other surface of the substrate,
 wherein each of the rear electrode layers is connected to the transparent electrode layer by a conductor that is insulated from the backside electrode layer through a first through hole that penetrates the substrate, the backside electrode layer, and the photoelectric conversion layer, and
 wherein said each of the rear electrode layers is connected to the backside electrode layer of an adjacent photovoltaic cell by a conductor that is insulated from the transparent electrode layer through a second through hole that penetrates the substrate.

8. The photovoltaic module according to claim 1, wherein the photovoltaic cell assembly and the diode assembly are sealed and united by a sealant.

9. The photovoltaic module according to claim 1, wherein one photovoltaic cell is directly above each diode.

10. The photovoltaic module according to claim 1, wherein three photovoltaic cells are directly above each diode.

* * * * *